United States Patent [19]

Smith et al.

[11] Patent Number: 5,730,853
[45] Date of Patent: Mar. 24, 1998

[54] METHOD FOR PLATING METAL MATRIX COMPOSITE MATERIALS WITH NICKEL AND GOLD

[75] Inventors: Carl R. Smith, Crystal Lake; Marvin J. Back, Schaumburg; Breton Johnson, Palatine; John R. De Valle, Elmhurst; Lawrence J. Maher, Lake In The Hills, all of Ill.

[73] Assignee: Northrop Grumman Corporation, Los Angeles, Calif.

[21] Appl. No.: 641,996

[22] Filed: Apr. 25, 1996

[51] Int. Cl.$^6$ .............................. C25D 5/34; C25D 5/44; C23C 28/02; B05D 1/36
[52] U.S. Cl. .................. 205/210; 205/213; 205/187; 427/405; 427/305; 427/309; 427/319; 427/380; 427/383.3
[58] Field of Search .......................... 205/210, 213, 205/187; 427/405, 305, 309, 319, 380, 393.3

[56] References Cited

U.S. PATENT DOCUMENTS

| | | | |
|---|---|---|---|
| 4,319,967 | 3/1982 | Vratny et al. | 205/210 |
| 4,341,823 | 7/1982 | Sexton et al. | 427/404 |
| 4,578,287 | 3/1986 | Divecha et al. | 427/250 |
| 4,795,658 | 1/1989 | Kano et al. | 427/305 |
| 4,840,820 | 6/1989 | Schultz et al. | 427/305 |
| 5,100,049 | 3/1992 | Divecha et al. | 228/198 |
| 5,100,476 | 3/1992 | Mase et al. | 134/1 |
| 5,213,841 | 5/1993 | Gulla et al. | 427/98 |
| 5,219,815 | 6/1993 | Krulik et al. | 502/200 |

*Primary Examiner*—Kathryn L. Gorgos
*Assistant Examiner*—Edna Wong
*Attorney, Agent, or Firm*—Terry J. Anderson; Karl J. Hoch, Jr.

[57] ABSTRACT

A method for plating a graphite aluminum metal matrix composite material with nickel and gold utilizes the steps of: cleaning a surface of the metal matrix composite material so as to substantially remove grease and particulates therefrom; forming a layer of copper upon the surface of the metal matrix composite material; heating the copper layer to drive out entrapped fluids; applying acid to the copper layer to remove oxidation therefrom; forming a layer of nickel upon at least a portion of the layer of copper; heating the nickel layer to relieve stress therein; and electrolytically forming a layer of gold upon at least a portion of the layer of nickel.

10 Claims, 6 Drawing Sheets

```
┌─ 200
│ ┌─────────────────────────────────────────────────────────┐
│ │ SHIPLEY 231 CLEANER/CONDITIONER, 2% (VOL/VOL) 231 –     │ ~201
│ │ 98% (VOL/VOL) WATER AT 112°F (44°C) FOR 1 MIN.          │
│ ├─────────────────────────────────────────────────────────┤
│ │ HOT TAP WATER RINSE AT 98°F (37°C) FOR 2 MIN.           │ ~202
│ ├─────────────────────────────────────────────────────────┤
│ │ COLD DEIONIZED WATER RINSE AT 69°F (21°C) FOR 2 MIN.    │ ~203
│ ├─────────────────────────────────────────────────────────┤
│ │ 10% (VOL/VOL) $H_2SO_4$ AT 97°F (36°C) FOR 10 SEC.      │ ~204
│ ├─────────────────────────────────────────────────────────┤
│ │ COLD DEIONIZED WATER RINSE AT 69°F (21°C) FOR 2 MIN.    │ ~205
│ ├─────────────────────────────────────────────────────────┤
│ │ NEOGANTH B PREDIP AT 72°F (22°C) FOR 45 SEC.            │ ~206
│ ├─────────────────────────────────────────────────────────┤
│ │ NEOGANTH ACTIVATOR AT 116°F (47°C) FOR 1 MIN.           │ ~207
│ ├─────────────────────────────────────────────────────────┤
│ │ COLD DEIONIZED WATER RINSE AT 69°F (21°C) FOR 2 MIN.    │ ~208
│ ├─────────────────────────────────────────────────────────┤
│ │ NEOGANTH REDUCER AT 94°F (34°C) FOR 1 MIN.              │ ~209
│ ├─────────────────────────────────────────────────────────┤
│ │ HOT TAP WATER RINSE AT 98°F (37°C) FOR 1 MIN.           │ ~210
│ ├─────────────────────────────────────────────────────────┤
│ │ COLD DEIONIZED WATER RINSE AT 69°F (21°C)               │ ~211
│ ├─────────────────────────────────────────────────────────┤
│ │ SHIPLEY 328-Q ELECTROLESS COPPER AT ROOM                │ ~212
│ │ TEMPERATURE FOR 24 MIN.                                 │
│ ├─────────────────────────────────────────────────────────┤
│ │ HOT TAP WATER RINSE AT 98°F (37°C) FOR 2 MIN.           │ ~213
│ ├─────────────────────────────────────────────────────────┤
│ │ DIP IN 10% $H_2SO_4$ AT 97°F (36°C) SOLUTION            │ ~214
│ ├─────────────────────────────────────────────────────────┤
│ │ MACDERMID 9241 BRIGHT (ACID) COPPER PLATE AT ROOM       │
│ │ TEMPERATURE. DEPOSIT COPPER 100 TO 200 MICROINCHES      │ ~215
│ │ THICK (20AMPS/SQUARE FOOT)                              │
│ ├─────────────────────────────────────────────────────────┤
│ │ COLD DEIONIZED WATER RINSE AT 69°F (21°C) FOR 2 MIN.    │ ~216
│ └─────────────────────────────────────────────────────────┘
└─
```

*FIG. 3*

METHOD FOR PLATING METAL MATRIX COMPOSITE MATERIALS WITH NICKEL AND GOLD

FIELD OF THE INVENTION

The present invention relates generally to metal plating methodology and more particularly to a method for plating a graphite aluminum metal matrix composite material with nickel and gold.

BACKGROUND OF THE INVENTION

Metal plating techniques for use in various different fields, e.g., automotive, microelectronics, machine tools, etc., are well known. Although many different techniques have been developed over the years for plating various different materials with various different metals, new techniques must continuously evolve in order to meet industry's continuously changing requirements for metal plating of new and different materials. For example, in the manufacture of microelectronic packages and carrier plates, i.e., hybrids, multichip modules (MCMs), microwave integrated circuits (MICs), application specific integrated circuits (ASICs), monolithic microwave integrated circuits (MMICs), thermal planes and constraining cores for printed wiring boards (PWBs), and heat sinks and heat exchangers, new techniques must continuously evolve to take advantage of new material packages.

The next generation of high performance electronics will place even more emphasis on increasing packaging and thermal densities, improving reliability, and reducing weight. High performance electronics subsystems and systems will continue to incorporate increasing quantities of MMICs and ASICs. Various forms of microelectronic packaging including MCMs lead to thermal management challenges. Conventional materials such as aluminum, Kovar, molybdenum, copper-molybdenum-copper do not meet today's high performance system requirements. Therefore, composite materials are required to meet low coefficient of thermal expansion (CTE), high thermal conductivity, high stiffness, and low density requirements.

Graphite aluminum metal matrix composite material's physical properties meet the next generation requirements for high performance electronics. This metal matrix composite material has vast potential applications in electronics packaging. A weight savings of 65% can be realized for microelectronic packages by replacing the conventional Kovar housing material with this metal matrix composite material. Thermal conductivity of the graphite aluminum metal matrix composite material is 6–10 times that of Kovar. The graphite aluminum metal matrix composite material is easily machined. The material can be produced via low cost casting operations.

Standard metal alloys used in microelectronic packaging require nickel-gold plating. In most applications, an underlayer of nickel is directly plated to the surface of the metal alloy. A layer of gold, one-fiftieth the thickness of the nickel layer, is deposited over the nickel. Graphite aluminum metal matrix composite material versions of microelectronic packages, thermal planes, etc. must be receptive to nickel-gold or nickel-only plating in order to satisfy electrical performance requirements and military standards. A high quality plating is required to prevent corrosion of the graphite and aluminum metal matrix composite galvanic couple. The plating must prevent moisture from entering the composite material. A repeatable plating technique for the graphite aluminum metal matrix composite material did not exist in the engineering community until this technology breakthrough.

Although various different metal plating process exist in the prior art, each metal plating process has unique and specific applicability to a particular application. It is desirable to provide a method for plating graphite aluminum metal matrix composite material with nickel and gold to provide a material which meets military and high performance commercial electronics packaging requirements.

SUMMARY OF THE INVENTION

The present invention specifically addresses and alleviates the above-mentioned deficiencies associated with the prior art. More particularly, the present invention generally comprises the steps of cleaning a surface of the metal matrix composite material, forming a layer of copper upon the surface of the metal matrix composite material, heating the copper layer to drive out entrapped fluids, applying acid to the copper to remove oxidation therefrom, forming a layer of nickel upon at least a portion of the layer of copper, heating the nickel layer to release stress formed therein, and electrolytically forming a layer of gold upon at least a portion of the layer of nickel.

This procedure results in a Class 4, 0.001 inch thick electroless nickel plate per MIL-C-26074C and a Type III, Grade A, 50 to 225 microinch thick gold plate per MIL-G-45204B.

Nickel-gold plating formed according to the present invention on graphite aluminum metal matrix composite has survived several critical environmental and mechanical verification tests. First, the nickel-gold plate survived high temperatures to 608° F. (320° C.), the 80 Au-20 Sn (gold-tin) solder reflow temperature requirement, without blistering, flaking or cracking. The plating also survived temperature cycling evaluation per Method 1010, Condition C of MIL-STD-883C. Per test condition C, the plating endured a 65° C. (having a tolerance of −10° C./+0° C.) to +150° C. (having a tolerance of +15° C./−0° C.) temperature swing for ten cycles. An examination of the test pieces following the temperature cycling did not reveal any evidence of structural defects to the plating.

In addition to temperature testing, the nickel-gold plated graphite aluminum metal matrix composite material survived salt atmosphere evaluation. The plated test articles endured three separate salt atmosphere tests per MIL-STD-883C, Method 1009 at test conditions A, B, and C, corresponding to test durations of 24, 48, and 96 hours, respectively. Viewed at ten to twenty times magnification, less than five percent of the graphite aluminum metal matrix composite material surface contained corrosion products or structural defects, meeting the pass criteria of MIL-STD-883C. The 24 hour test pieces were virtually absent of corrosion products, including minor stains. To the naked eye, the 48 hour pieces resembled the 24 hour pieces. However, under magnification, a few scattered corrosion products, notably oxides, were visible. Numerous small corrosion stains were visible on the 96 hour test pieces, yet under magnification, the stains covered less than five percent of the surface.

The adhesion of the nickel-gold plating was also verified. A 90° peel test was performed using adhesively backed tape per ASTM B 571-91, "Standard Test Methods for Adhesion of Metallic Coatings." None of the five plating samples subjected to the test showed evidence of failure in the plating to graphite aluminum metal matrix composite material interface.

These, as well as other advantages of the present invention will be more apparent from the following description

BRIEF DESCRIPTION OF THE DRAWINGS

FIG. 3 is a block diagram illustrating the steps involved in forming a base layer of copper upon the aluminum metal matrix composite material;

DETAILED DESCRIPTION OF THE PREFERRED EMBODIMENT

The detailed description set forth below in connection with the appended drawings is intended as a description of the presently preferred embodiment of the invention, and is not intended to represent the only form in which the present invention may be constructed or utilized. The description sets forth the sequence of steps for performing the procedure in connection with the illustrated embodiment. It is to be understood, however, that the same or equivalent functions and sequences may be accomplished by different embodiments that are also intended to be encompassed within the spirit and scope of the invention.

The method for plating a graphite aluminum metal matrix composite material with nickel and gold according to the present invention is illustrated in FIGS. 1 through 8, which depict a presently preferred embodiment of the invention.

Figure 1:
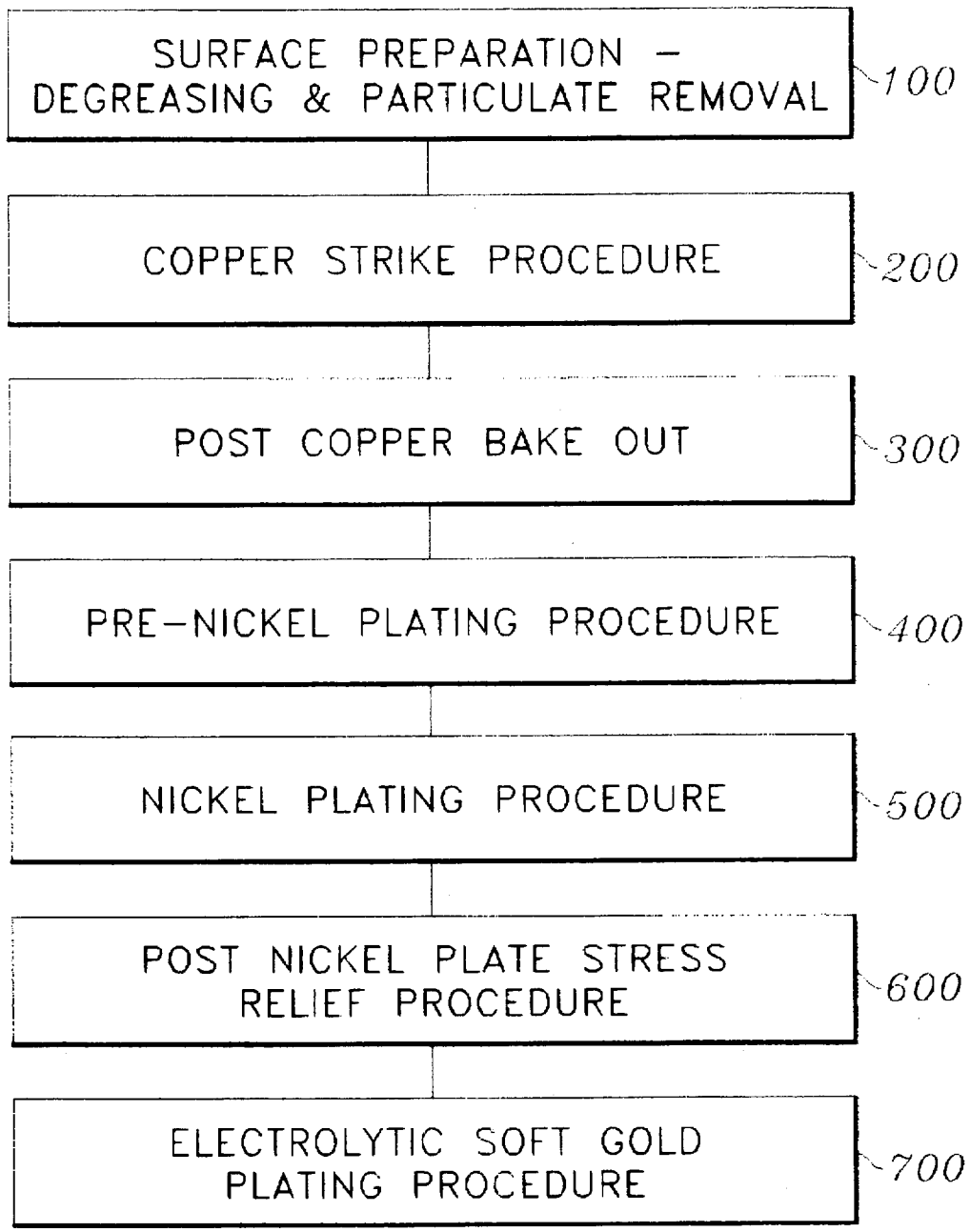
FIG. 1 is a block diagram illustrating the overall process for plating a graphite aluminum metal matrix composite material with nickel and gold.

Referring now to FIG. 1, the method generally comprises the steps of surface preparation 100, copper strike procedure 200, post copper bake out procedure 300, pre-nickel plating procedure 400, nickel plating procedure 500, post nickel plate stress relief procedure 600, and electrolytic soft gold plating procedure 700. Each of these steps is broken down into a series of further steps, as discussed in detail below.

Figure 2:
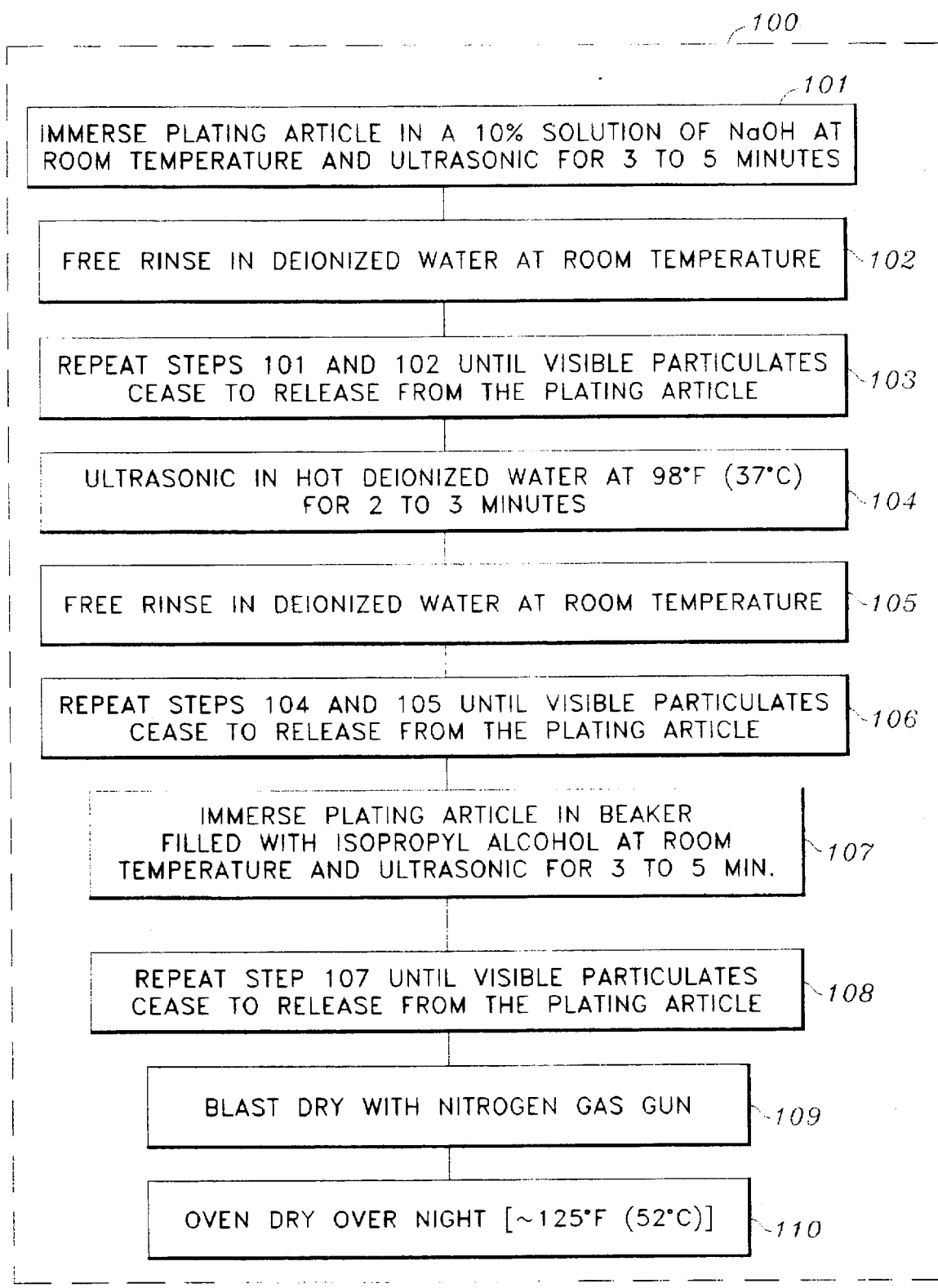
FIG. 2 is a block diagram illustrating the steps involved in the surface preparation of the graphite aluminum metal matrix composite material to be plated.
Figure 4:
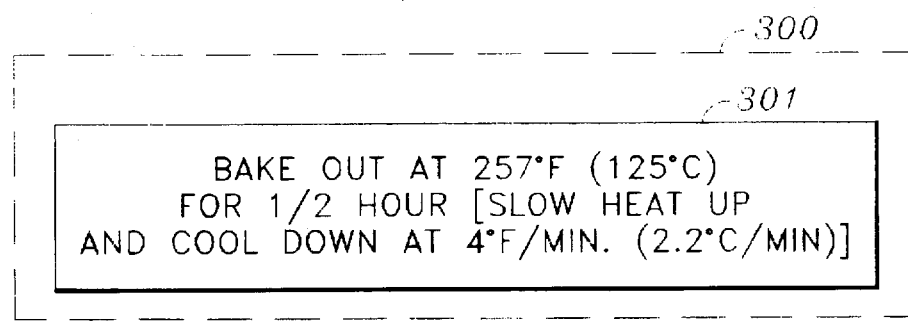
FIG. 4 is a block diagram illustrating the steps involved in heating the proper layer so as to drive undesirable substances therefrom.
Figure 5:
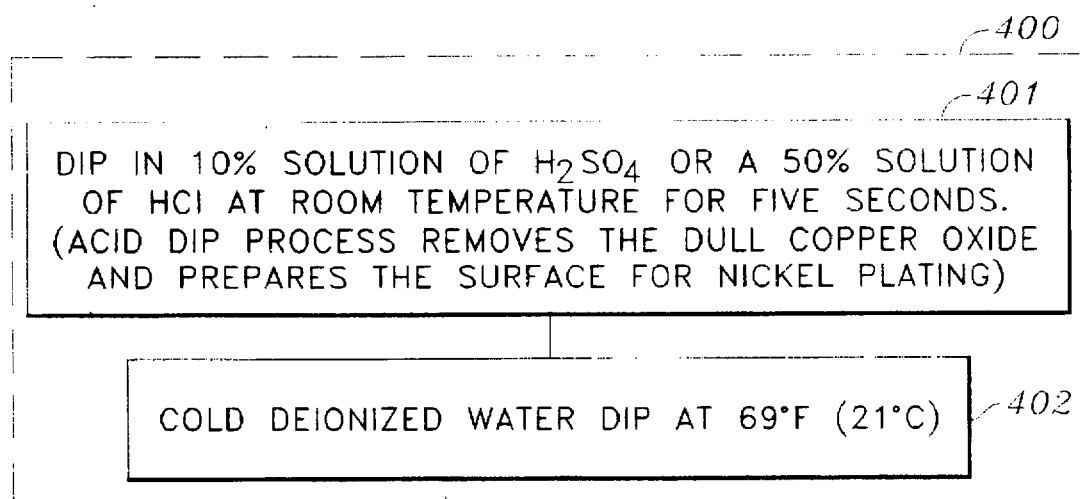
FIG. 5 is a block diagram illustrating the steps involved in preparing for the formation of a layer of nickel upon the base layer of copper.
Figure 6:
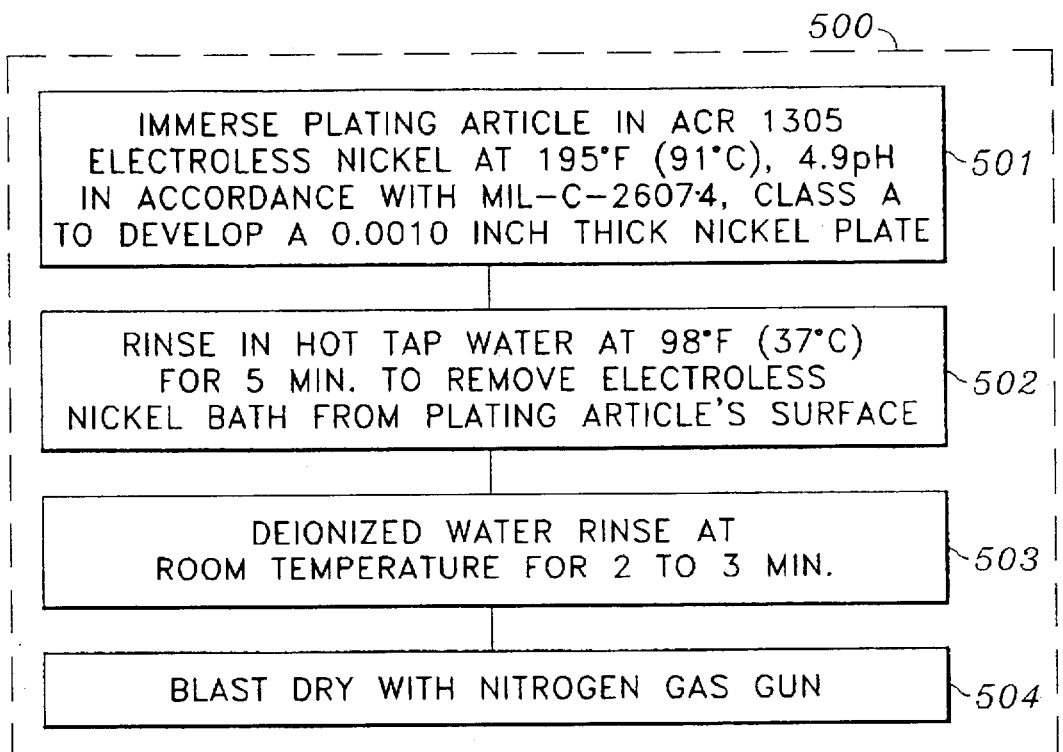
FIG. 6 is a block diagram illustrating the steps involved in the nickel plating procedure.
Figure 7:
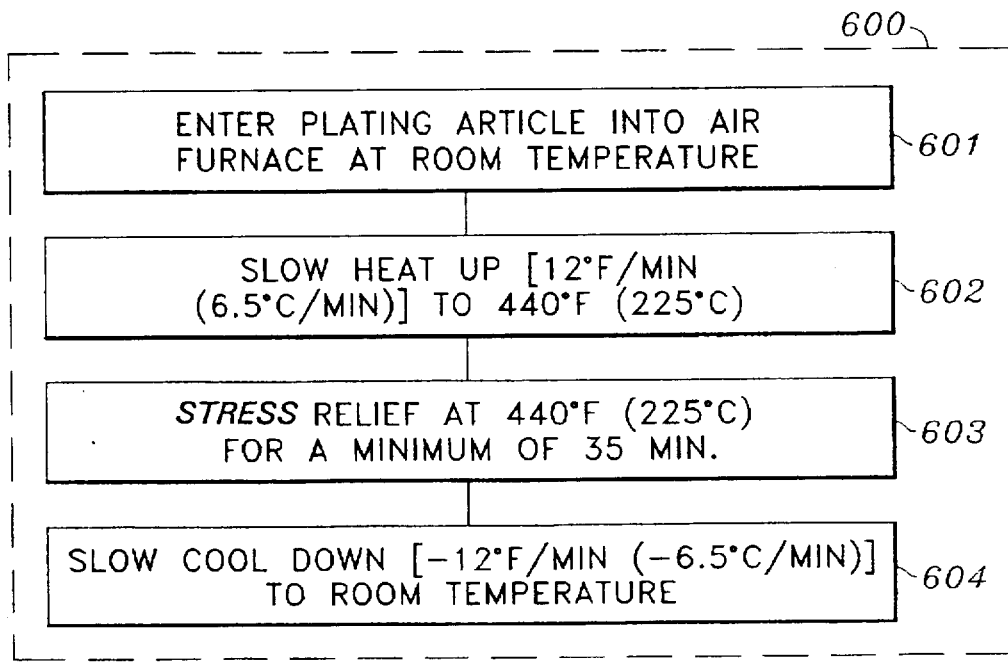
FIG. 7 is a block diagram illustrating the steps involved in the nickel plate stress relief procedure.
Figure 8:
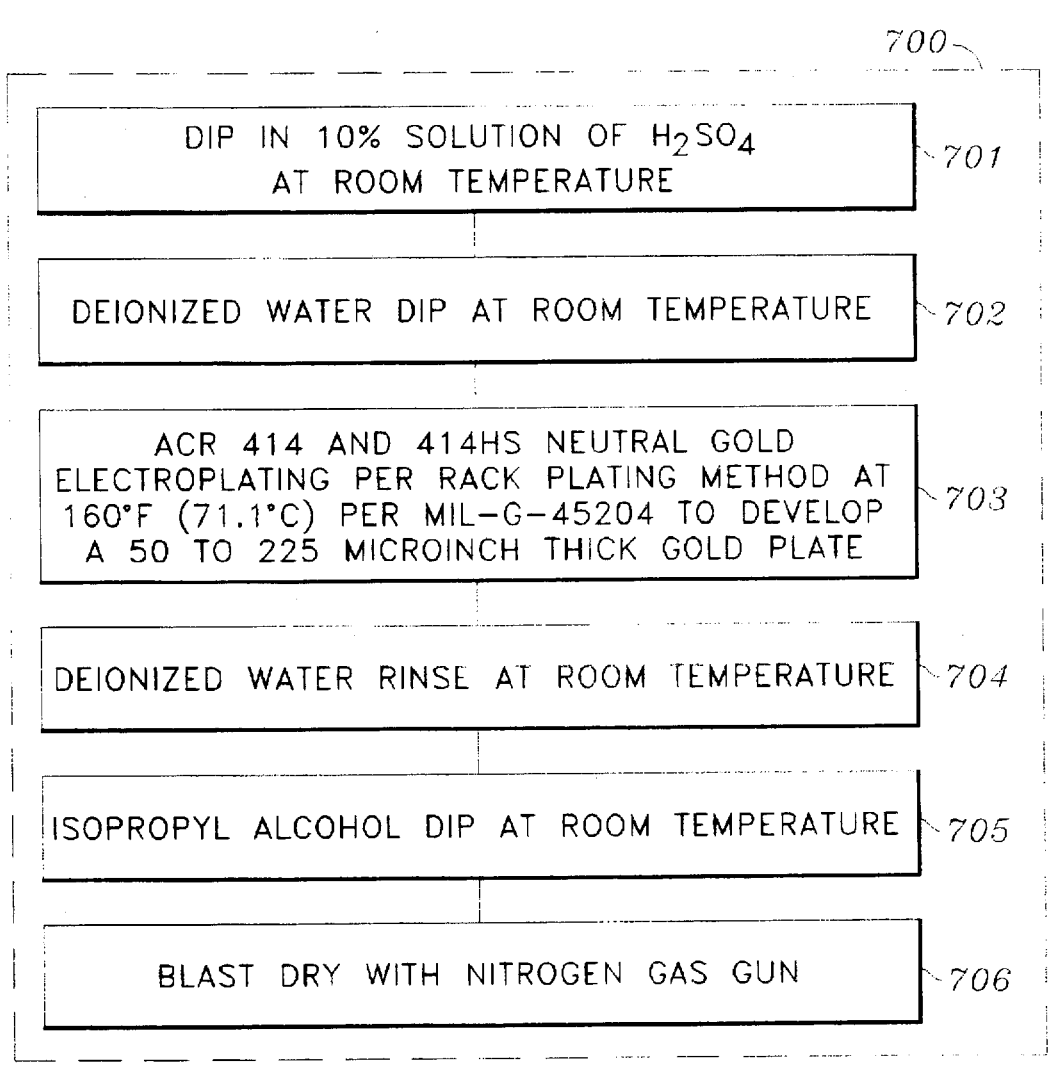
FIG. 8 is a block diagram illustrating the steps involved in the electroplating of gold upon the nickel layer.

Referring now to FIG. 2, the steps utilized in surface preparation 100 are performed so as to effect degreasing and particulate removal from the plating article or graphite aluminum metal matrix composite material to be coated with nickel and gold. According to the presently preferred embodiment of the present invention, the steps utilized in surface preparation 100 comprise: immersing the graphite aluminum metal matrix composite material in a 10% solution of NaOH at room temperature and then ultrasonically cleaning the graphite aluminum metal matrix composite material for three to five minutes 101; free rinsing the graphite aluminum metal matrix composite material with deionized water at room temperature 102; repeating the immersing in NaOH and rinsing steps until visible particulates cease to be released from the graphite aluminum metal matrix composite material 103; ultrasonically cleaning the graphite aluminum metal matrix composite material in deionized water at 98° F. (37° C.) for two to three minutes 104; again, free rinsing the graphite aluminum metal matrix composite material with deionized water at room temperature 105; repeating the ultrasonic cleaning in deionized water and rinsing steps until visible particulates cease to be released from the graphite aluminum metal matrix composite material 106; immersing the graphite aluminum metal matrix composite material in a container, e.g., a beaker filled with isopropyl alcohol at room temperature and ultrasonic cleaning for three to five minutes 107; repeating the ultrasonic cleaning in alcohol until all visible particulates cease to be released from the aluminum metal matrix composite material 108; blast drying the graphite aluminum metal matrix composite material with a nitrogen gas gun 109; and oven drying the graphite aluminum metal matrix composite material overnight at a temperature of 125° F. (52° C.) 110.

According to the presently preferred embodiment of the present invention, the copper strike procedure 200 comprises the steps of: immersing the graphite aluminum metal matrix composite material in solution containing 2%, by volume, alkaline cleaner/conditioner, such as SHIPLEY 231 CLEANER/CONDITIONER and 98%, by volume, water at 112° F. (44° C.) for one minute 201; rinsing the graphite aluminum metal matrix composite material in tap water at 98° F. (37° C.) for two minutes 202; rinsing the graphite aluminum metal matrix composite material in deionized water at 69° F. (21° C.) for two minutes 203; immersing the graphite aluminum metal matrix composite material in a 10%, by volume, $H_2SO_4$ at 97° F. (36° C.) for ten seconds 204; rinsing the graphite aluminum metal matrix composite material in deionized water at 69° F. (21° C.) for two minutes 205; immersing the graphite aluminum metal matrix composite material in predip, such as NEOGANTH B PREDIP at 72° F. (22° C.) for 45 seconds 206; immersing the graphite aluminum metal matrix composite material in an organic palladium colloid, such as NEOGANTH ACTIVATOR at 116° F. (47° C.) for one minute 207; rinsing the graphite aluminum metal matrix composite material in deionized water at 69° F. (21° C.) for two minutes 208; immersing the graphite aluminum metal matrix composite material in a reduction solution, such as NEOGANTH REDUCER at 94° F. (34° C.) for one minute 209; rinsing the graphite aluminum metal matrix composite material in tap water at 98° F. (37° C.) for one minute 210; rinsing the graphite aluminum metal matrix composite material in deionized water at 69° F. (21° C.) 211; forming a layer of copper upon the graphite aluminum metal matrix composite material by placing the graphite aluminum metal matrix composite material in bath of an electroless copper, such as SHIPLEY 328-Q ELECTROLESS COPPER at room temperature for 24 minutes 212; rinsing the graphite aluminum metal matrix composite material in tap water at 98° F. (37° C.) for two minutes 213; and dipping the graphite aluminum metal matrix composite material in a 10%, by volume, solution of $H_2SO_4$ at 97° F. (36° C.) 214; electroplating the graphite aluminum metal matrix composite material with copper utilizing an acid copper plating, such as MACDERMID 9241 BRIGHT (Acid) COPPER PLATE at room temperature so as to deposit a layer of copper 100 to 200 microinches in thickness, utilizing 20 amps/square foot 215; and rinsing the graphite aluminum metal matrix composite material in deionized water at 69° F. (21° C.) for two minutes 216.

According to the presently preferred embodiment of the present invention the step of post copper bake out 300 comprises the step of baking the graphite aluminum metal matrix composite material at 257° F. (125° C.) for one-half hour, wherein the graphite aluminum metal matrix composite material is heated up and cooled down at 4° F./minute (2.2° C./minute) 301.

According to the presently preferred embodiment of the present invention, the step of pre-nickel plating 400 comprises: dipping the graphite aluminum metal matrix composite material in 10%, by volume, solution of $H_2SO_4$ at room temperature for five seconds so as to remove the dull copper oxide and prepare the copper surface for nickel plating 401; and dipping the graphite aluminum metal matrix composite material in deionized water at 69° F. (21° C.) 402.

According to the presently preferred embodiment of the present invention, the step of nickel plating 500 comprises: immersing the graphite aluminum metal matrix composite material in electroless nickel, such as ACR 1305 ELECTROLESS NICKEL at 195° F. (91° C.), 4.9 pH in accordance with military standard MIL-C-26074C, Class 4 to form a 0.001 inch thick nickel layer 501; rinsing the graphite aluminum metal matrix composite material in tap water at 98° F. (37° C.) for five minutes so as to remove the electroless nickel bath from the graphite aluminum metal matrix composite material surface 502; rinsing the graphite aluminum metal matrix composite material in deionized water at room temperature for two to three minutes 503; and blast drying the graphite aluminum metal matrix composite material with a nitrogen gas gun 504.

According to the presently preferred embodiment of the present invention, the step of post nickel plate stress relief 600 comprises the steps of: placing the graphite aluminum metal matrix composite material in an air furnace at room temperature 601; slowly heating the graphite aluminum metal matrix composite material up at 12° F./minute (6.5° C./minute) to 440° F. (225° C.) 602; stress relieving the graphite aluminum metal matrix composite material at 440° F. (225° C.) for a minimum of 35 minutes 603; and slowly cooling the graphite aluminum metal matrix composite material down −12° F./minute (−6.5° C./minute) to room temperature 604.

According to the presently preferred embodiment of the present invention, the step of electrolytic soft gold plating 700 comprises: dipping the graphite aluminum metal matrix composite material in a 10% solution of $H_2SO_4$ at room temperature 701; dipping the graphite aluminum metal matrix composite material in deionized water at room temperature 702; electroplating the graphite aluminum metal matrix composite material with soft gold electroplating, such as, ACR 414 AND 414 HS NEUTRAL GOLD ELECTROPLATING per rack plating method at 160° F. (71.1° C.) per military standard MIL-G-45204B, Type III, Grade A to form a 50 to 225 microinch thick gold layer 703; rinsing the graphite aluminum metal matrix composite material in deionized water at room temperature 704; dipping the graphite aluminum metal matrix composite material in isopropyl alcohol at room temperature 705; and blast drying the graphite aluminum metal matrix composite material with a nitrogen gas gun 706.

Preparing the graphite aluminum metal matrix composite material surface 101 is a highly critical process which must be performed prior to plating. Raw graphite aluminum metal matrix composite material has a dull black appearance due to loose graphite particles on its surface. The loose particles inhibit uniform plating deposition, and also inhibit plating adhesion upon exposure to elevated temperatures. Removing the particles is essential to a successful nickel-gold plate.

Thorough cleaning requires ultrasonic agitation. Agitation in a bath of 10% sodium hydroxide (NaOH) solution works best but drawbacks exist. Prolonged exposure to the sodium hydroxide reduces the aluminum exposed on the metal matrix composite material surface and causes detrimental pitting. Therefore, three to five minute agitation cycles must be used to limit the sodium hydroxide solution's penetration into the porous material.

Ultrasonic agitation in hot deionized water is necessary to drive out sodium hydroxide solution entrapped beneath the metal matrix composite material's surface. Agitation in isopropyl alcohol acts to force the deionized water from the porous matrix. Finally, baking the graphite aluminum metal matrix composite material overnight at 125° F. (52° C.) is absolutely critical to fully vaporize the alcohol and residual moisture.

Poor cleaning or failure to drive away moisture with elevated temperatures results in a graphite aluminum metal matrix composite material surface incapable of accepting a copper layer. Blisters may form during the copper plating process due to improper surface preparation.

It has been found that phosphorus-based electroless nickel directly deposited to the graphite aluminum metal matrix composite material cracks or blisters when exposed to 392° F. (200° C.). The cracking or blistering arises from a substantial coefficient of thermal expansion mismatch between the rigid metal matrix composite material and the brittle nickel. The solution to this problem, as with many plating challenges, involves attaching a flexible copper barrier between the metal matrix composite material and the nickel plate.

To enhance the bond between the graphite aluminum metal matrix composite material surface and the copper layer, a molecular-thin layer of palladium is optionally formed upon the graphite aluminum metal matrix composite material first. This method is commonly used to plate copper on polyamide printed wiring boards. Typical methods for depositing palladium involve reducing a palladium tin-chloride complex with hydrochloric acid. However, the palladium tin-chloride/hydrochloric acid process catastrophically attacks the surface of the graphite aluminum metal matrix composite material, much like the sodium hydroxide solution used during the cleaning process. Consequently, a palladium deposition process, non-harmful to the metal matrix composite material surface and produced by the Chemcut Corporation, is used in the graphite aluminum metal matrix composite material plating process.

Steps 206 through 209 of FIG. 3 show the palladium deposition steps used in the graphite aluminum metal matrix composite material plating process. Plating bath immersion times were substantially reduced from Chemcut's operational guidelines. Reducing the immersion times was critical to avoid penetration of the solutions below the graphite aluminum metal matrix composites material's surface. If excessive amounts are not prevented from becoming entrapped inside the porous metal matrix composite material, blistering or flaking of the nickel plating layer will most certainly occur.

Both electroless 212 and electrolytic 215 copper are used to generate the flexible copper barrier. The electroless 212 process produces a copper layer only a few microinches thick. The electrolytic 215 process is used to increase the copper thickness to one-hundred to two-hundred microinches. The one-hundred to two-hundred microinch thickness produces the optimum flexible barrier. Copper layers plated to greater than or less than the specified thickness produce blisters in the nickel layer during plating 500.

Following the copper strike, the first critical heat treatment 300 is required. Heating (baking) the copper plated graphite aluminum metal matrix composite material part drives out any fluids entrapped below the surface during the cleaning or palladium deposition procedures. In order to achieve the 608° F. (320° C.) survival goal with nickel plating attached, it is important to optimize the copper plate bake-out temperature and duration. The bake-out schedule 300 limits the oxidation of the copper plate and drives away the remaining moisture. Excessive oxidation, resulting from exceedingly high bake-out temperatures and dwells, is removed 400 to provide the uniform, flexible copper barrier required between the nickel plate and the graphite aluminum metal matrix composite material.

Stress relieving the nickel deposit 600 is absolutely critical to ensure good adhesion. Following the procedure of the present invention develops a Class 4, 0.001 inch thick nickel coating per MIL-C-26074C.

Plating the external gold layer 700 does not pose any significant challenges once a high quality nickel layer has been accomplished. The gold selected for the graphite aluminum metal matrix composite material plating process is specifically designed for high temperature applications [842° F. (450° C.) and above] and gold wire bonding. The process develops a Type III, Grade A gold plate per MIL-G-45204B which is 50 to 225 microinches thick.

The Shipley products utilized in the present invention are available from Shipley Company, Inc. of Newton, Mass.; the Chemcut products, i.e., NEOGANTH B PREDIP, NEOGANTH ACTIVATOR, and NEOGANTH REDUCER, are available from Chemcut Corporation of State College, Pa.; the ACR products are available from American Chemical and Refining Company, Inc. of Waterbury, Conn.; and the MacDermid products are available from MacDermid Inc. of Waterbury, Conn.

It is understood that the exemplary method of coating a graphite aluminum metal matrix composite material described herein and shown in the drawings represents only a presently preferred embodiment of the invention. Indeed, various modifications and additions may be made to such embodiment without departing from the spirit and scope of the invention. Thus, these and other modifications and additions may be obvious to those skilled in the art and may be implemented to adapt to the present invention for use in a variety of different applications.

What is claimed is:

1. A method for plating a graphite aluminum metal matrix composite material, the method comprising the steps of:
   a) cleaning a surface of the metal matrix composite material;
   b) forming a layer of copper upon the surface of the metal matrix composite material;
   c) heating the copper layer to drive out entrapped fluids;
   d) applying acid to the copper layer to remove oxidation therefrom;
   e) forming a layer of nickel upon at least a portion of the layer of copper; and
   f) heating the nickel layer to relieve stress therein.

2. The method as recited in claim 1, further comprising the step of electrolytically forming a layer of gold upon at least a portion of the layer of nickel.

3. The method as recited in claim 1, wherein the step of cleaning comprises degreasing and particulate removal.

4. The method as recited in claim 1 further comprising the step of forming a molecular-thin layer of palladium upon the metal matrix composite material prior to the step of forming a layer of copper thereon.

5. The method as recited in claim 1 comprises the steps of:
   a) immersing the metal matrix composite material in an approximate 10% solution of NaOH at room temperature and applying ultrasonic agitation for approximately three to five minutes;
   b) rinsing the metal matrix composite material with deionized water at approximately room temperature;
   c) repeating steps (a) and (b) until visible particulates cease to be released from the metal matrix composite material;
   d) applying ultrasonic agitation to the metal matrix composite material while immersed within deionized water having a temperature of approximately 37° C. for approximately between two to three minutes;
   e) rinsing the metal matrix composite material with deionized water at approximately room temperature;
   f) repeating steps (d) and (e) until visible particulates cease to be released from the metal matrix composite material;
   g) immersing the metal matrix composite material in isopropyl alcohol at approximately room temperature and ultrasonically agitated for approximately between three to five minutes;
   h) repeating step (g) until visible particulates cease to be released from the metal matrix composite material;
   i) drying the metal matrix composite material with dry nitrogen gas; and
   j) further drying the metal matrix composite material by heating overnight at a temperature of approximately 52° C.

6. The method as recited in claim 1, wherein the step of forming a layer of copper comprises:
   a) washing the metal matrix composite material in a solution containing approximately 2% alkaline cleaner/conditioner and approximately 98% water, by volume at approximately 44° C. for approximately one minute;
   b) rinsing the metal matrix composite material in tap water having a temperature of approximately 37° C. for approximately 2 minutes;
   c) rinsing the metal matrix composite material in 21° C. deionized water for approximately 2 minutes;
   d) immersing the metal matrix composite material in a solution of approximately 10% $H_2SO_4$ at approximately 36° C. for approximately ten seconds;
   e) rinsing the metal matrix composite material in deionized water at approximately 21° C. for approximately two minutes;
   f) immersing the metal matrix composite material in predip solution at approximately 22° C. for approximately 45 seconds;
   g) immersing the metal matrix composite material in organic palladium colloid solution at approximately 47° C. for approximately one minute;
   h) rinsing the metal matrix composite material in deionized water at approximately 21° C. for approximately two minutes;
   i) immersing the metal matrix composite material in reduction solution at approximately 34° C. for approximately one minute;

j) rinsing the metal matrix composite material with tap water at approximately 37° C. for approximately one minute;

k) immersing the metal matrix composite material in deionized water at approximately 21° C.;

l) immersing the metal matrix composite material in electroless copper solution at approximately room temperature for approximately 24 minutes;

m) rinsing the metal matrix composite material with tap water at approximately 37° C. for approximately 2 minutes;

n) immersing the metal matrix composite material in a solution of 10% $H_2SO_4$ at approximately 36° C.;

o) using acid copper plate solution at approximately room temperature to deposit a layer of copper of approximately 100 to 200 microinches in thickness using approximately 20 amps/square foot current; and p) rinsing the metal matrix composite material with deionized water at approximately 21° C. for approximately two minutes.

7. The method as recited in claim 1, wherein the step of heating the copper layer comprises heating the copper layer to approximately 125° C. for approximately 30 minutes wherein the heating is performed at a rate of approximately 2.2° C./min.

8. The method as recited in claim 1, wherein the step of applying acid to the copper layer comprises:

a) immersing the copper layer in one of an approximate 10% solution of $H_2SO_4$ or an approximate 50% solution of HCl at approximately room temperature for approximately five seconds; and b) immersing the copper layer in deionized water at approximately 21° C.

9. The method as recited in claim 1, wherein the step of forming a layer of nickel comprises:

a) immersing the metal matrix composite material in electroless nickel solution at approximately 91° C., 4.9 pH, in accordance with multi-standard MIL-C-26074C, Class 4, to form a layer of nickel having a thickness of approximately 0.001 inch;

b) rinsing the metal matrix composite material in tap water having a temperature of approximately 37° C. for approximately five minutes;

c) rinsing the metal matrix composite material in deionized water at approximately room temperature for approximately two to three minutes; and d) drying the metal matrix composite material with dry nitrogen gas.

10. The method as recited in claim 1, wherein the step of heating the nickel layer comprises:

a) depositing the metal matrix composite material within an air furnace at approximately room temperature;

b) heating the metal matrix composite material at a rate of approximately 6.5° C./minute to a temperature of approximately 225° C.;

c) maintaining the metal matrix composite material at a temperature of approximately 225° C. for a minimum duration of 35 minutes; and d) cooling the metal matrix composite material at a rate of approximately 6.5° C./minute to approximately room temperature.

* * * * *